United States Patent
Nähring et al.

(10) Patent No.: US 11,187,737 B2
(45) Date of Patent: Nov. 30, 2021

(54) SYSTEM AND METHOD FOR CALIBRATING RADIO FREQUENCY TEST CHAMBERS

(71) Applicant: Rohde & Schwarz GmbH & Co. KG, Munich (DE)

(72) Inventors: Alexander Nähring, Munich (DE); Meik Kottkamp, Munich (DE); Markus Herbrig, Grafing (DE); Aytac Kurt, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 16/533,318

(22) Filed: Aug. 6, 2019

(65) Prior Publication Data

US 2020/0386799 A1 Dec. 10, 2020

(30) Foreign Application Priority Data

Jun. 6, 2019 (EP) ...................... 19178656

(51) Int. Cl.
*G01R 29/08* (2006.01)
*H04B 17/12* (2015.01)
*H04B 17/21* (2015.01)
*G01R 29/10* (2006.01)

(52) U.S. Cl.
CPC ....... *G01R 29/0821* (2013.01); *G01R 29/105* (2013.01); *H04B 17/12* (2015.01); *H04B 17/21* (2015.01)

(58) Field of Classification Search
CPC . H04W 24/02; H04B 17/0085; H04B 17/309; H04B 17/318; H04B 17/11; H04B 17/12; H04B 17/20; H04B 17/21; G01R 29/0821; G01R 29/105; G01R 29/0871; G01R 29/0892; G01R 35/005
See application file for complete search history.

(56) References Cited

U.S. PATENT DOCUMENTS

| | | | | |
|---|---|---|---|---|
| 6,313,799 | B1 * | 11/2001 | Thimm | H04B 7/08 343/703 |
| 8,964,891 | B2 | 2/2015 | Tsofe | |
| 9,319,908 | B2 * | 4/2016 | Nickel | H04W 24/06 |
| 9,954,279 | B1 * | 4/2018 | Pabst | H04B 17/102 |
| 10,177,862 | B2 * | 1/2019 | Wen | H04B 7/04 |

(Continued)

FOREIGN PATENT DOCUMENTS

| | | |
|---|---|---|
| BR | 201002876 A2 | 5/2012 |
| CA | 2840397 A1 | 4/2013 |

(Continued)

*Primary Examiner* — Seokjin Kim
(74) *Attorney, Agent, or Firm* — Ditthavong, Steiner & Mlotkowski

(57) ABSTRACT

A system for calibrating radio frequency test chambers is provided. The system comprises an antenna array with a plurality of antenna elements arranged in a three dimensional configuration, a plurality of power measuring units downstream to the plurality of antenna elements and a processing unit. In this context, the plurality of power measuring units output a power from each antenna elements corresponds to a radiation pattern generated by an incident test signal. The processing unit is configured to analyze the power distribution of the test signal in order to calculate a calibration.

14 Claims, 4 Drawing Sheets

(56) References Cited

U.S. PATENT DOCUMENTS

| | | | |
|---|---|---|---|
| 10,649,023 B2* | 5/2020 | Harteneck | H04B 17/309 |
| 2011/0094996 A1 | 4/2011 | Yamazawa et al. | |
| 2011/0202299 A1 | 8/2011 | Youn | |
| 2012/0053879 A1* | 3/2012 | Chang | H04B 17/21 702/104 |
| 2012/0138164 A1 | 6/2012 | Bolan et al. | |
| 2012/0154122 A1 | 6/2012 | Hong et al. | |
| 2014/0042337 A1 | 2/2014 | Biloiu et al. | |
| 2014/0220903 A1 | 8/2014 | Schulz et al. | |
| 2015/0054510 A1 | 2/2015 | Biber et al. | |
| 2015/0358337 A1 | 12/2015 | Keller | |
| 2016/0015956 A1 | 1/2016 | Tieck et al. | |
| 2017/0223559 A1 | 8/2017 | Kong et al. | |
| 2018/0228647 A1 | 8/2018 | Escaf et al. | |
| 2018/0254840 A1* | 9/2018 | Foegelle | H04B 17/3912 |
| 2019/0356397 A1* | 11/2019 | DaSilva | G01R 29/10 |
| 2019/0372218 A1* | 12/2019 | Vehovc | H01Q 3/34 |
| 2020/0076073 A1* | 3/2020 | Hill | H01Q 3/267 |
| 2020/0096547 A1* | 3/2020 | Orozco Valdes | G01R 29/0871 |
| 2020/0096554 A1* | 3/2020 | Orozco Valdes | H01L 22/34 |
| 2020/0228211 A1* | 7/2020 | Dao | H04B 17/14 |

FOREIGN PATENT DOCUMENTS

| | | |
|---|---|---|
| CA | 2975488 A1 | 8/2016 |
| CN | 101604397 A | 12/2009 |
| CN | 101895352 A | 11/2010 |
| CN | 103476169 A | 12/2013 |
| CN | 104618041 A | 5/2015 |
| CN | 104661237 A | 5/2015 |
| CN | 104729497 A | 6/2015 |
| CN | 105022020 A | 11/2015 |
| CN | 105093147 A | 11/2015 |
| CN | 105574452 A | 5/2016 |
| CN | 106100760 A | 11/2016 |
| CN | 206096274 U | 4/2017 |
| CN | 106771897 A | 5/2017 |
| CN | 107025751 A | 8/2017 |
| CN | 108828485 A | 11/2018 |
| CN | 109239741 A | 1/2019 |
| FR | 2838000 A1 | 10/2003 |
| FR | 2863807 A1 | 6/2005 |
| GB | 200109409 | 1/2001 |
| GB | 201403615 | 1/2014 |
| IL | 125221 A | 12/1999 |
| IL | 188507 A | 6/2012 |
| IN | 2007DE00398 A | 4/2007 |
| JP | 2001185542 A | 7/2001 |
| KR | 20040007351 A | 1/2004 |
| NO | 9802483 | 1/1998 |
| WO | 9320440 A1 | 10/1993 |
| WO | 9508774 A2 | 3/1995 |
| WO | 9619737 A1 | 6/1996 |
| WO | 9932904 A1 | 7/1999 |
| WO | 200049680 A1 | 8/2000 |
| WO | 200207993 A2 | 1/2002 |
| WO | 200348463 A2 | 6/2003 |
| WO | 200363245 A2 | 7/2003 |
| WO | 200612550 A2 | 2/2006 |
| WO | 2006108026 A2 | 10/2006 |
| WO | 2010065593 A2 | 6/2010 |
| WO | 2013181162 A1 | 12/2013 |
| WO | 2014151852 A1 | 9/2014 |
| WO | 2015150487 A1 | 10/2015 |
| WO | 2017005554 A1 | 1/2017 |
| WO | 2017189355 A1 | 2/2017 |

* cited by examiner

SYSTEM AND METHOD FOR CALIBRATING RADIO FREQUENCY TEST CHAMBERS

PRIORITY

This application claims priority of European patent application EP 19 178 656.5 filed on Jun. 6, 2019, which is incorporated by reference herewith.

FIELD OF THE INVENTION

The invention relates to a system and a corresponding method for calibrating radio frequency test chambers, especially for calibrating path loss at specific locations within a radio frequency test chamber where a potential device under test will be positioned during measurements.

BACKGROUND OF THE INVENTION

Over the air (OTA) measurements are the standardized methods to evaluate radio performance in wireless systems. The OTA measurements attempt to determine the performance of radio transmitters and receivers (e.g. mobile phones) in a test environment that closely simulate the conditions in which the devices will be tested. In the attempt of confiscating the test system's influence from the radiated power and sensitivity results, the device under test (DUT) is replaced by a reference antenna with known gain characteristics and a reference path loss measurement is performed. The reference measurement is then combined with the known gain of the reference antenna in order to determine an isotropic reference correction for the power and sensitivity results.

For example, U.S. Pat. No. 8,964,891 B2 shows a method for calibrating an antenna system with two or more passive antennas. A known signal is received and/or transmitted by each of the antennas and the differences in resulting output from the antennas is compared with one another. Based on the differences, calibration offsets are defined to improve the system performance. However, such calibration process is dependent on the propagation direction of the test signal which leads to complex positioning of the DUT. Furthermore, the calibration of individual OTA paths has to be performed in a successive number of measurements to record the path loss as calibration information, which drastically increases the overall measurement time.

Accordingly, there is a need to provide a system and a method for calibrating radio frequency test chambers, especially for calibrating path loss at specific locations where the DUT will be positioned even for an arbitrary direction and angle of the test signal in order to achieve simplified DUT positioning and thereby significantly expediting the measurement process.

SUMMARY OF THE INVENTION

According to a first aspect of the invention, a system for calibrating radio frequency test chambers is provided. The system comprises an antenna array with a plurality of antenna elements arranged in a three dimensional configuration, a plurality of power measuring units downstream to the plurality of antenna elements and a processing unit. In this context, the plurality of power measuring units output a power from each antenna elements corresponding to a radiation pattern generated by an incident test signal. The processing unit is configured to analyze the power distribution of the test signal in order to calculate a calibration result or setup.

Therefore, each power measuring unit senses and reports a current incident power with respect to an incident test signal where the user may define the target location and incident angle on the antenna array. The processing unit de-embeds the corresponding radiation pattern and determines the antenna elements with highest power for each path of the incident signal at the defined receive location with the defined incident angle. The processing unit further analyzes the power distribution of the incident signal and calculate the calibration result corresponding to the incident test signal paths. Advantageously, no direction dependent path loss calibration is required.

According to a first preferred implementation form of said first aspect of the invention, the directivity and the incident angle of the test signal are predetermined and the test signal is generated from one or more test antennas. Advantageously, multipath over the air test signals with arbitrary direction and incident angle are simulated.

According to a second preferred implementation form of said first aspect of the invention, the antenna array is adapted to receive each signal path corresponding to the one or more test antennas. Advantageously, path loss calibration for multipath test signal is simultaneously performed.

According to a further preferred implementation form of said first aspect of the invention, the processing unit is further configured to quantify a time variance in the measured output powers simultaneously measured at the plurality of antenna elements. Advantageously, the reliability of receiving diversity schemes can be simulated in order to emulate spatial correlation, polarization, field incidence and so on. In addition, the possibility to simultaneously measure power at multiple locations facilitates the validation of the quiet zone in the radio frequency chamber.

According to a further preferred implementation form of said first aspect of the invention, the antenna array is a patch antenna array with main radiation direction in three dimensions. In addition, the antenna array is situated in a fixed location within the radio frequency test chamber. Advantageously, a vast coverage for potential incident angle is provided.

According to a further preferred implementation form of said first aspect of the invention, the antenna array is dynamically expandable along at least one direction. In addition, the antenna array may be expanded in real-time, even when the measurement is being taken place. Advantageously, an uninterrupted measurement is carried out particularly when an adjustment is required in order to simulate a larger device under test.

According to a further preferred implementation form of said first aspect of the invention, the antenna array creates a three dimensional enclosure and wherein the plurality of power measuring units are confined within the enclosure. The three dimensional enclosure may be formed in any shape, for instance cubic, rectangular cuboid, spherical and so on. The power measurement units are place in the vicinity of the antenna elements within the enclosure which reduces the amount of long cables required and thereby reducing insertion loss and signal degradation. Advantageously, the system performance is improved significantly.

According to a further preferred implementation form of said first aspect of the invention, the system further comprises a control unit adapted to orient at least one of the plurality of antenna elements in order to align the maximum gain of the antenna array in the incident direction of the test signal. Advantageously, a high directivity of the antenna array is achieved.

According to a further preferred implementation form of said first aspect of the invention, the system further comprises a switch matrix connecting the plurality of power measuring units to the processing unit. In this context, the switch matrix is adapted to input the measured power from each of the plurality of antenna elements to the processing unit. The switch matrix may comprise additional signal conditioning means such as attenuators, filters, directional couplers and so on. Advantageously, multiple input multiple output transmission as well as multiplexing operation can be performed in a bidirectional manner.

According to a further preferred implementation form of said first aspect of the invention, the system further comprises a memory in order to store the measured powers and the calibration result. The measured powers can be used multiple times for correlation adjustment with respect to the calibration result. In addition, the calibration results are required to be stored and used to correct the over the air performance test results for a given radio frequency chamber. Furthermore, a former calibration result can be accessed at any time to effectively identify any error that may occur during the current measurement. Advantageously, the system accuracy is significantly improved.

According to a second aspect of the invention, a method for calibrating radio frequency test chambers using an antenna array with a plurality of antenna elements arranged in a three dimensional configuration is provided. The method comprises the steps of measuring a power from each antenna elements corresponding to a radiation pattern generated by an incident test signal and analyzing the power distribution of the test signal in order to calculate a calibration result or setup.

Therefore, appropriate antenna elements are used to receive an incident test signal and the radiation pattern is de-embedded in order to determine the antenna elements with highest power for each path of the incident signal at the defined receive location with the defined incident angle. In addition, the power distribution of the incident signal is further analyzed and the calibration result is calculated corresponding to the incident test signal paths. Advantageously, no direction dependent path loss calibration is required.

According to a first preferred implementation form of said second aspect of the invention, the method further comprises the step of generating the test signal from one or more test antennas with a predetermined directivity and incident angle. Advantageously, multipath over the air test signals with arbitrary direction and incident angle are simulated.

According to a second preferred implementation form of said second aspect of the invention, the method further comprises the step of receiving each signal path corresponding to the one or more test antennas. Advantageously, path loss calibration for multipath test signal is simultaneously performed.

According to a further preferred implementation form of said second aspect of the invention, the method further comprises the step of quantifying a time variance in the measured output powers simultaneously measured at the plurality of antenna elements. Advantageously, the reliability of receiving diversity schemes can be simulated in order to emulate spatial correlation, polarization, field incidence and so on. In addition, the possibility to simultaneously measure power at multiple locations facilitate the validation of the quiet zone in the radio frequency chamber.

According to a further preferred implementation form of said second aspect of the invention, the method further comprises the step of orienting at least one of the plurality of antenna elements in order to align the maximum gain of the antenna array in the incident direction of the test signal. Advantageously, a high directivity of the antenna array is achieved.

BRIEF DESCRIPTION OF THE DRAWINGS

Exemplary embodiments of the invention are now further explained with respect to the drawings by way of example only, and not for limitation. In the drawings.

DETAILED DESCRIPTION OF PREFERRED EMBODIMENTS

Reference will now be made in detail to the embodiments of the present invention, examples of which are illustrated in the accompanying drawings. However, the following embodiments of the present invention may be variously modified and the range of the present invention is not limited by the following embodiments.

Figure 1:
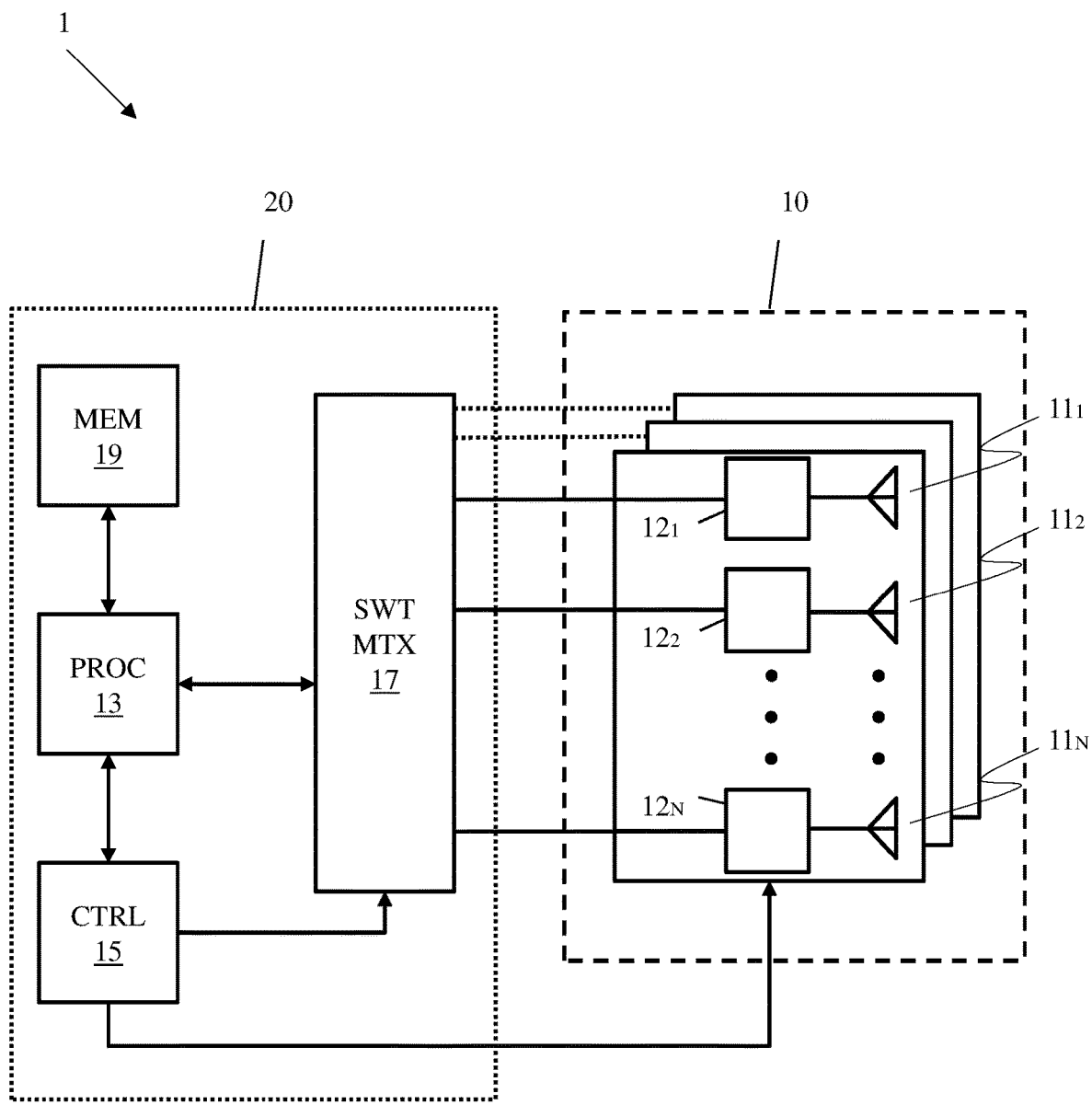
FIG. 1 shows a block diagram of the system according to the first aspect of the invention.

In FIG. 1, a block diagram of the system 1 according to the first aspect of the invention is illustrated. The system 1 comprises an antenna array 10 with a plurality of antenna elements $11_1, 11_2, \ldots, 11_N$ that are arranged in a three dimensional configuration and creates a three dimensional enclosure. The system 1 further comprises a plurality of power measuring units $12_1, 12_2, \ldots, 12_N$ downstream to the plurality of antenna elements and are confined within the three dimensional enclosure. The antenna array 10 receives signal paths from a test signal (not shown) and the power measuring units $12_1, 12_2, \ldots, 12_N$ sense a power from each antenna elements $11_1, 11_2, \ldots, 11_N$ corresponding to a radiation pattern that is generated by the test signal. A processing unit 13 determines antenna elements $11_1, 11_2, \ldots, 11_N$ with highest power to identify the incident direction of the test signal and further analyzes the power distribution of the test signal in order to calculate a calibration result.

The system 1 further comprises a switch matrix 17 connected in-between the antenna array 10 and the processing unit 13 connecting each of the power measuring units $12_1, 12_2, \ldots, 12_N$ to a signal bus and inputs the measured power form the antenna elements $11_1, 11_2, \ldots, 11_N$ to the processing unit 13. Ideally, the switch matrix 17 is adapted to switch power values of the radio frequency signals in the form of analog and/or digital values. The switch matrix 17 may comprise additional signal conditioning means such as attenuators, filters, directional couplers and so on. The operation of said signal conditioning means are known in the art and therefore is not herein described in greater details.

The processing unit 13 is connected to a memory 19 and a control unit 15. The control unit 15 is connected to the switch matrix 17 to control the switching operation and is further connected to the antenna array 10 to orient the antenna elements $11_1, 11_2, \ldots, 11_N$ in order to align the maximum gain of the antenna array 10 in the incident direction of the test signal.

It is to be noted, that the plurality of antenna elements $11_1, 11_2, \ldots, 11_N$ and the plurality of power measuring units $12_1, 12_2, \ldots, 12_N$ are also collectively referred to as the antenna array 10. Furthermore, the processing unit 13, the control unit 15, the switch matrix 17 and the memory 19 are collectively referred to as tester 20 in general.

Figure 2:
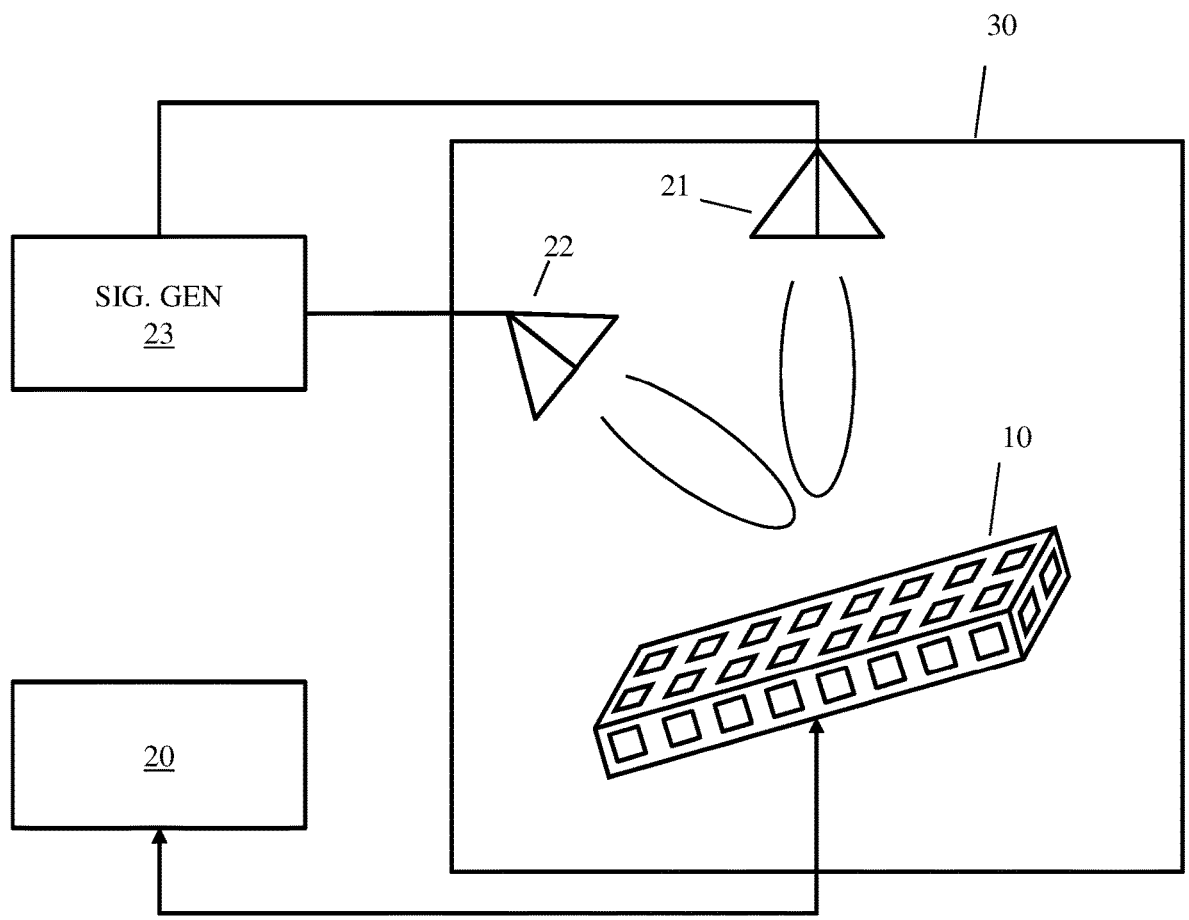
FIG. 2 shows a block diagram of the system performing calibration of a radio frequency chamber according to the first aspect of the invention by way of example only.

In FIG. 2, a block diagram of the system 1 performing calibration of a radio frequency chamber 30 according to the first aspect of the invention is illustrated by way of example only. A test signal is generated from a signal generator 23 through two test antennas 21, 22 in the radio frequency test chamber 30. A user may align the test antennas 21, 22 as desired and specify the location where the potential device under test (DUT) antennas will be located. The antenna array 10 is fixed on the test location and acts as a reference antenna to facilitate path loss calibration. The spatial arrangement of the antenna elements $11_1, 11_2, \ldots, 11_N$ on the antenna array 10 is simulated as the potential DUT antennas and the power measuring units $12_1, 12_2, \ldots, 12_N$ reports the power of each path at the defined receive location with the defined incident angle. The measured power outputs are fed to the tester 20 where the tester 20 further analyzes the power distribution of the test signal to calculate a calibration result. Consequently, path loss calibration is performed simultaneously for each path of the test signal at arbitrary locations where the DUT antennas will be tested.

Figure 3A:
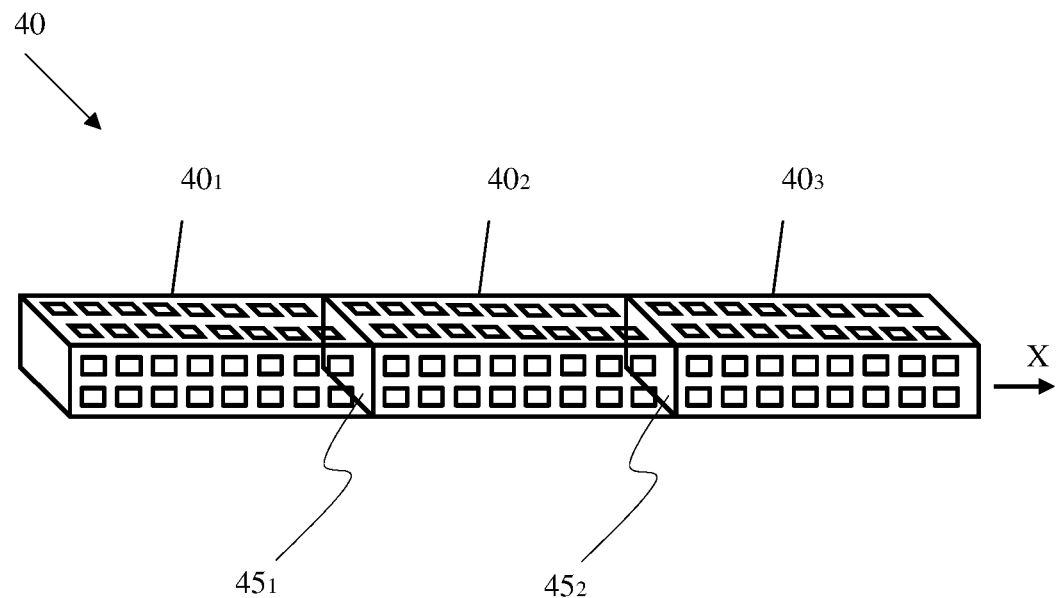
FIG. 3a shows a first exemplary embodiment of the antenna array extension scheme according to the first aspect of the invention.

In FIG. 3a, a first exemplary embodiment of the antenna array 40 extension scheme according to the first aspect of the invention is illustrated. The cuboid antenna array 40 comprises there array sections $40_1$, $40_2$ and $40_3$. It is to be noted that each array sections $40_1, 40_2, 40_3$ corresponds to the antenna array 10 comprising the antenna elements $11_1, 11_2, \ldots, 11_N$ and the power measuring units $12_1, 12_2, \ldots, 12_N$. The consecutive sections are separated by cascading planes $45_1, 45_2$. The control unit 15 generates a control signal in order to activate the array sections $40_1, 40_2, 40_3$ and thereby connecting the array sections $40_1, 40_2, 40_3$ in series on the cascading planes $45_1, 45_2$ along the extension axis X. The array sections $40_1, 40_2, 40_3$ can be activated one after another or simultaneously. The total number of array sections $40_1, 40_2, 40_3$ is not limited to three, the number of array sections $40_1, 40_2, 40_3$ can be more or less depending on the size of the radio frequency chamber 30 as well as on the spatial arrangement of the potential DUT antennas. Furthermore, the shape of the antenna array 40 as well as the array sections $40_1, 40_2, 40_3$ are not limited to cuboid only. Any other shape, for instance, cubic, spherical and so on, also falls within the scope of the invention.

Figure 3B:
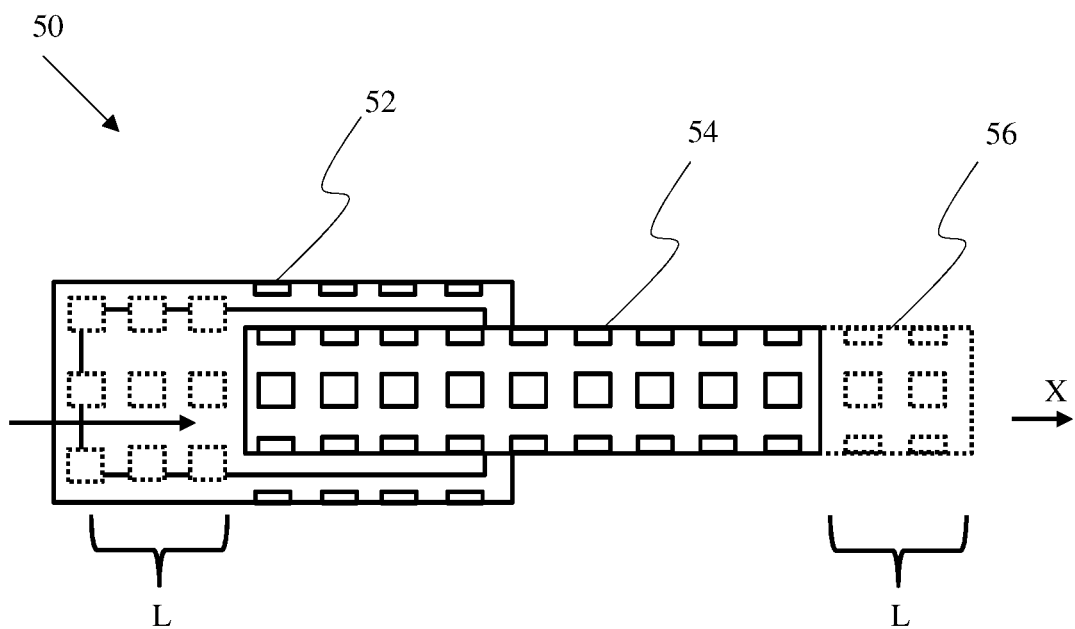
FIG. 3b shows a second exemplary embodiment of the antenna array extension scheme according to the first aspect of the invention.

In FIG. 3b, a second exemplary embodiment of the antenna array 50 extension scheme according to the first aspect of the invention is illustrated. The antenna array 50 is arranged in a box within a box formation where an inner array segment 54 is partially confined within an outer array segment 52. The inner array segment 54 is adapted to move along the extension axis X. The lateral displacement of the inner array segment 54 results in an extended array segment 56 with a lateral deflection of L. The control unit 15 controls the movement of the inner array segment 54, preferably by means of servomechanism and extends the antenna array 50 corresponding to the potential DUT and/or as desired. Although, a rectangular shape is illustrated for the antenna array 50, it is possible to implement other shapes, for instance cylindrical shape, convenient to construct the three dimensional antenna array 50. In contrast to the extension scheme illustrated in FIG. 3a, the antenna elements $11_1, 11_2, \ldots, 11_N$ and the power measuring units $12_1, 12_2, \ldots, 12_N$ of the array segments 52, 54, 56 remain active whether they are confined or not.

Figure 4:
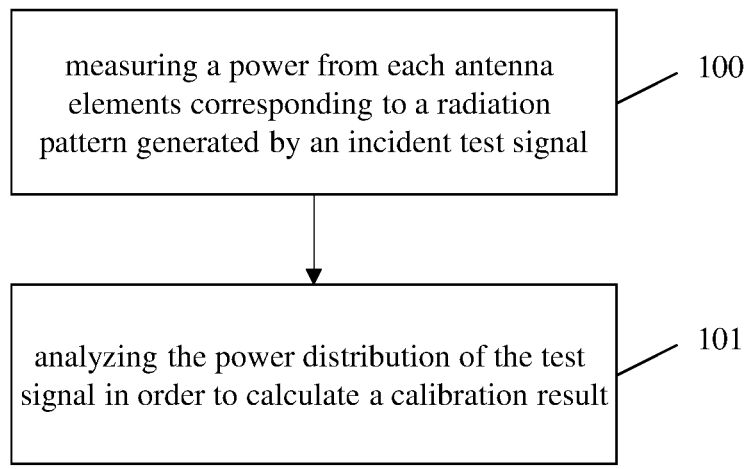
FIG. 4 shows a flow chart of an exemplary embodiment of the second aspect of the invention.

In FIG. 4, a flow chart of an exemplary embodiment of the inventive method according to the second aspect of the invention is illustrated. In a first step 100, a power is measured from each antenna elements corresponding to a radiation pattern generated by an incident test signal. In a second step 101, the power distribution of the test signal is analyzed in order to calculate a calibration result.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A system for calibrating radio frequency test chambers comprising:
    an antenna array with a plurality of antenna elements arranged in a three-dimensional configuration,
    a plurality of power measuring units configured downstream to the plurality of antenna elements, and
    a processing unit,
    wherein each of the plurality of power measuring units measures a power from each of the antenna elements corresponding to a radiation pattern generated by an incident test signal,
    wherein the processing unit is configured to analyze the power distribution of the test signal in order to calculate a calibration, and
    wherein the antenna array is dynamically expandable along at least one direction.

2. The system according to claim 1,
    wherein the directivity and the incident angle of the test signal are predetermined and wherein the test signal is generated from one or more test antennas.

3. The system according to claim 1,
    wherein the antenna array is adapted to receive each signal path corresponding to the one or more test antennas.

4. The system according to claim 1,
wherein the processing unit is further configured to quantify a time variance in the measured output powers simultaneously measured at the plurality of antenna elements.

5. The system according to claim 1,
wherein the antenna array is a patch antenna array with main radiation direction in three dimensions, and
wherein the antenna array is situated in a fixed location within a radio frequency test chamber.

6. The system according to claim 1,
wherein the antenna array creates a three-dimensional enclosure and wherein the plurality of power measuring units is confined within the enclosure.

7. The system according to claim 1,
wherein the system further comprises a control unit adapted to orient at least one of the plurality of antenna elements in order to align the maximum gain of the antenna array in the incident direction of the test signal.

8. The system according to claim 1,
wherein the system further comprises a switch matrix connecting the plurality of power measuring units to the processing unit, and
wherein the switch matrix is adapted to input the measured power from each of the plurality of antenna elements to the processing unit.

9. The system according to claim 1,
wherein the system further comprises a memory in order to store the measured powers and the calibration.

10. A method for calibrating radio frequency test chambers using an antenna array with a plurality of antenna elements arranged in a three-dimensional configuration comprising the steps of:
measuring a power from each of the antenna elements corresponding to a radiation pattern generated by an incident test signal, and
analyzing the power distribution of the test signal in order to calculate a calibration,
wherein the antenna array is dynamically expandable along at least one direction.

11. The method according to claim 10,
wherein the method further comprises the step of generating the test signal from one or more test antennas with a predetermined directivity and incident angle.

12. The method according to claim 10,
wherein the method further comprises the step of receiving each signal path corresponding to the one or more test antennas.

13. The method according to claim 10,
wherein the method further comprises the step of quantifying a time variance in the measured output powers simultaneously measured at the plurality of antenna elements.

14. The method according to claim 10,
wherein the method further comprises the step of orienting at least one of the plurality of antenna elements in order to align the maximum gain of the antenna array in the incident direction of the test signal.

* * * * *